United States Patent
Fukasawa et al.

(10) Patent No.: US 8,021,723 B2
(45) Date of Patent: Sep. 20, 2011

(54) METHOD OF PLASMA TREATMENT USING AMPLITUDE-MODULATED RF POWER

(75) Inventors: Yasushi Fukasawa, Tama (JP); Mitsutoshi Shuto, Tama (JP); Yasuaki Suzuki, Tama (JP)

(73) Assignee: ASM Japan K.K., Tokyo (JP)

( * ) Notice: Subject to any disclaimer, the term of this patent is extended or adjusted under 35 U.S.C. 154(b) by 929 days.

(21) Appl. No.: 11/946,022

(22) Filed: Nov. 27, 2007

(65) Prior Publication Data

US 2009/0136683 A1 May 28, 2009

(51) Int. Cl.
- H05H 1/30 (2006.01)
- H05H 1/32 (2006.01)
- H05H 1/24 (2006.01)
- C23C 16/00 (2006.01)
- C23C 14/02 (2006.01)
- B05D 3/00 (2006.01)

(52) U.S. Cl. .................. 427/569; 427/255.28; 427/534; 427/535; 427/575; 427/255.394; 427/294; 427/393.1

(58) Field of Classification Search .................. 427/569, 427/255.28, 534, 535, 575, 255.394, 294, 427/393.1
See application file for complete search history.

(56) References Cited

U.S. PATENT DOCUMENTS

| | | | |
|---|---|---|---|
| 5,562,952 A * | 10/1996 | Nakahigashi et al. | 427/534 |
| 5,573,981 A * | 11/1996 | Sato | 438/778 |
| 5,946,542 A * | 8/1999 | Iyer | 438/7 |
| 6,472,822 B1 | 10/2002 | Chen et al. | |
| 6,628,500 B1 * | 9/2003 | Thomas et al. | 361/234 |
| 2007/0264791 A1 * | 11/2007 | Han et al. | 438/424 |
| 2009/0056627 A1 | 3/2009 | Shuto et al. | |

FOREIGN PATENT DOCUMENTS

| | | |
|---|---|---|
| JP | 03-044472 | 2/1991 |
| JP | 06-338476 | 12/1994 |
| JP | 07-013518 | 1/1995 |
| JP | 07-183236 | 7/1995 |
| JP | 2002-270577 A | 9/2002 |
| JP | 2003-532986 | 11/2003 |
| JP | 2005-142582 A | 6/2005 |
| JP | 2005-310945 A | 11/2005 |
| WO | WO 01/84591 | 11/2001 |

OTHER PUBLICATIONS

U.S. Appl. No. 11/847,962, filed Aug. 30, 2007, Shuto, Mitsutoshi, et al.

* cited by examiner

*Primary Examiner* — Timothy Meeks
*Assistant Examiner* — Mandy Louie
(74) *Attorney, Agent, or Firm* — Knobbe Martens Olson & Bear LLP (57) ABSTRACT

A method for processing a substrate by plasma CVD includes: (i) forming a film on a substrate placed on a susceptor by applying RF power between the susceptor and a shower plate in the presence of a film-forming gas in a reactor; and (ii) upon completion of step (i), without unloading the substrate, applying amplitude-modulated RF power between the susceptor and the shower plate in the absence of a film-forming gas but in the presence of a non-film-forming gas to reduce a floating potential of the substrate.

24 Claims, 6 Drawing Sheets

METHOD OF PLASMA TREATMENT USING AMPLITUDE-MODULATED RF POWER

BACKGROUND OF THE INVENTION

1. Field of the Invention

The present invention generally relates to semiconductor processing in a plasma treatment apparatus, particularly to a method of reducing a floating potential of a substrate upon film formation.

2. Description of the Related Art

In capacity-coupled plasma CVD, a floating voltage is generated on a substrate placed on a substrate processing base while film is being formed. This substrate voltage remains in the substrate after the film forming process has completed, and may sometimes cause the substrate to be attracted to the substrate processing base, in which case a problem will occur in the subsequent process of transferring the substrate.

The sticking force that applies between the wafer and electrode is expressed by the formula below:

$$F = \frac{\varepsilon_0 \varepsilon_r S V_w^2}{2d^2}$$

Here, F (N) indicates the sticking force, $\varepsilon_0$ (F/m) indicates the dielectric constant in vacuum, $\varepsilon_r$ indicates the specific dielectric constant of anodic oxidation, S (m$^2$) indicates the wafer area, $V_w$ (V) indicates the floating potential of the wafer, and d (m) indicates the thickness of film generated by anodic oxidation. Based on the above formula, the sticking force can be decreased by lowering $V_w$.

Traditionally, the method of applying RF power continuously after the film forming process has completed to remove electric charges from the substrate has been used to reduce the sticking force of the wafer and electrode.

However, the aforementioned method presents problems in that it cannot lower the substrate voltage sufficiently if an increased number of substrates are processed, or under different substrate conditions such as when different types of fine processing have been applied to the substrate or depending on whether or not an insulation film is formed on the back of the substrate, in which case the substrate will still be attracted to the substrate processing base and proper transfer will be prevented.

SUMMARY OF THE INVENTION

In at least one embodiment of the present invention, only a gas that does not form film is supplied and a high-frequency power that has been amplitude-modulated is applied to cause discharge, in order to reduce the floating potential of the substrate after the film forming process has completed, thereby solving at least one of the aforementioned problems.

In other words, in at least one embodiment of the present invention the substrate voltage can be lowered sufficiently after the end of the process, which virtually eliminates the problem of unwanted substrate sticking or reduces such sticking significantly. Furthermore, in an embodiment of the present invention the time needed to reduce the floating potential of the substrate can be shortened, which has the effect of improving the productivity.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

The present invention will be explained in detail with reference to preferred embodiments. However, the preferred embodiments are not intended to limit the present invention.

In an embodiment, the present invention provides a method for processing a substrate by plasma CVD, comprising: (i) forming a film on a substrate placed on a susceptor by applying RF power between the susceptor and a shower plate in the presence of a film-forming gas in a reactor; and (ii) upon completion of step (i), without unloading the substrate, applying amplitude-modulated RF power between the susceptor and the shower plate in the absence of a film-forming gas but in the presence of a non-film-forming gas to reduce a floating potential of the substrate.

The above embodiments further include, but are not limited to, the following embodiments:

In any of the foregoing embodiments, the film forming step (step (i)) may include a surface treatment step wherein the surface of the substrate is treated using a plasma while substantially or nearly no film is formed in order to change chemical properties of the surface, e.g., changing hydrophilic or hydrophobic properties. The method may further comprise unloading the substrate upon completion of step (ii), and step (ii) may be initiated immediately before unloading the substrate or as a last step before unloading the substrate. Between step (i) and step (ii), preferably, a plasma is not extinct and remains even at a low density.

The amplitude-modulated RF power used in step (ii) may be constant and may have an electric power equal to or lower than the electric power of the RF power used in step (i). In the above, a square root of amplitude corresponds to power, and thus, strictly speaking, the amplitude-modulated RF power cannot be constant. However, because the frequency of amplitude modulation may be in a range of low frequencies or intermediate frequencies and is relatively so high that fluctuation of amplitude is negligible as compared with the frequency of the RF power itself. Thus, in embodiments, the RF power which is to be amplitude-modulated is used to indicate the amplitude-modulated RF power, since the amplitude-modulated RF power is generated by amplitude-modulating the RF power with an amplitude modulator. The amplitude modulator is typically but not necessarily in an on or off state, and when amplitude-modulating the RF power, the amplitude modulator is turned on. Alternatively, the amplitude-modulated RF power used in step (ii) may be ramped down continuously. Ramp rates may be such that if ramping continues, power is reduced to zero within 10 seconds (e.g., 7 seconds, 5 seconds). In an embodiment, the amplitude-modulated RF power may be reduced toward the end of step (ii) in a step or steps, in pulses, at rates decreasing or increasing with time, at a constant rate, or any two or more of the foregoing in combination. In any of the foregoing embodiments, step (ii) may be performed for 2 seconds or more but 10 seconds or less (preferably for 2 seconds or more but 3 seconds or less).

In any of the foregoing embodiments, in step (ii), the amplitude-modulated RF power may be the sole RF power. In another embodiment, a combination of the non-modulated RF power and the amplitude-modulated RF power can be used sequentially or simultaneously.

In any of the foregoing embodiments, the amplitude-modulated RF power used in step (ii) may have an electric power of 5 W to 50 W (including 10 W, 20 W, 30 W, 40 W, and values between any two values of the foregoing). In another embodiment, the electric power may be lower than 5 W (e.g., 2 W, 4 W) as long as a plasma is not extinct, and may be higher than 50 W (e.g., 60 W, 80 W, 100 W) as long as an adverse effect occur on a surface of the substrate (normally, lower than the RF power used for film formation). In another embodiment, the RF power to be amplitude-modulated may be 50 W to 3,000 W, depending on the type of process conducted prior to removal of floating potential.

In any of the foregoing embodiments, the amplitude-modulated RF power used in step (ii) may be amplitude-modulated with a sine wave of 100 Hz to 500 kHz (including 500 Hz, 1 kHz, 10 kHz, 100 kHz, 200 kHz, and values between any two numbers of the foregoing, preferably 1 kHz to 10 kHz in an embodiment) and may have an amplitude modulation ratio of 0.25 to 1.2 (including 0.5, 0.75, 1.0, and values between any values of the foregoing, preferably 0.8 to 1.0 in an embodiment). In the above, the amplitude modulation ratio is defined as (A−B)/(A+B) wherein A is the highest amplitude, and B is the lowest amplitude.

In any of the foregoing embodiments, the amplitude-modulated RF power may have a frequency of 2 MHz or higher (e.g., 13.56 MHz). The frequency corresponds to the frequency of the RF power which is to be amplitude-modulated. Typically, the RF power which is used for film formation may be used as base RF power which is to be amplitude-modulated, although RF power which is different from the RF power used for film formation can be used. In the case where combined RF power is used for film formation (e.g., a mixture of low-frequency RF power and high-frequency RF power), only the high-frequency RF power may be amplitude-modulated and used for removal of floating potential. In another embodiment, both or either one of the high-frequency RF power and the low-frequency RF power can be amplitude-modulated.

In any of the foregoing embodiments, the non-film-forming gas may be at least one selected from the group consisting of $N_2$, $N_2O$, $O_2$, Ar, and He. In another embodiment, H can be used, and in other embodiments, rare gas or inert gas can be used. In any of the foregoing embodiments, the film-forming gas in step (i) may comprise a source gas and an additive/carrier gas, and the non-film-forming gas in step (ii) may comprise the additive/carrier gas without the source gas. In the above, for example, in the case where SiO film is formed on the substrate, and $O_2$ gas may be used in the film formation step, $O_2$ gas can continuously be used for removal of floating potential of the substrate. Likewise, in the case where SiN film is formed on the substrate, and $N_2$ gas may be used in the film formation step, $N_2$ gas can continuously be used for removal of floating potential of the substrate. Further, in the case where SiON film is formed on the substrate, and $N_2O$ gas may be used in the film formation step, $N_2O$ gas can continuously be used for removal of floating potential of the substrate. Alternatively, gas which is not used for film formation can be used for removal of floating potential of the substrate. Suitable gas can be selected as long as a plasma is generated for removal of floating potential.

In any of the foregoing embodiments, a flow rate of gas used for removal of floating potential may be 100 sccm to 3,000 sccm (including 500 sccm, 1,000, sccm, 2,000 sccm, and values between any two values of the foregoing). The pressure may be 1 Torr to 10 Torr (preferably 2 Torr to 6 Torr), the temperature of the susceptor may be 300° C. to 650° C. (preferably 350° C. to 450° C.), and the temperature of the shower plate may be 50° C. to 200° C. (preferably 80° C. to 150° C.).

In another embodiment, the present invention provides a method for reducing a floating potential of a substrate on a susceptor in a plasma CVD reactor, comprising: upon completion of processing the substrate in the reactor and before unloading the substrate, applying amplitude-modulated RF power between the susceptor and a shower plate in the absence of a film-forming gas but in the presence of a non-film-forming gas for reducing a floating potential of the substrate to a set level.

In any of the foregoing embodiments, the amplitude-modulated RF power may have an amplitude modulation ratio of 0.25 to 1.2 (preferably 0.8 to 1.0).

In any of the foregoing embodiments, the amplitude-modulated RF power may be amplitude-modulated with a sine wave of less than 500 kHz (preferably 1 kHz to 10 kHz).

In any of the foregoing embodiments, the amplitude-modulated RF power may be generated by amplitude-modulating the RF power which is reduced with time toward the end of the step of applying the amplitude-modulated RF power. Various ways to reduce the amplitude-modulated power may be employed.

In any of the foregoing embodiments, the non-film-forming gas may be $O_2$, $N_2$, or $N_2O$.

In any of the foregoing embodiments, the non-film-forming gas may comprise an additive/carrier gas without a source gas used in the film formation. In another embodiment, the non-film-forming gas may be a gas which is not used in the film formation.

In any of the foregoing embodiments, the applying of the amplitude-modulated RF power may be conducted to reduce a floating potential of the substrate to ½ or less (including ¼, ⅐, 1/10, 1/20, and values between any two numbers of the foregoing, preferably 1/10 or less) of a floating potential of the substrate obtained with RF power without the amplitude modulation.

In any of the foregoing embodiments, the amplitude-modulated RF power may be applied to the shower plate. In an embodiment, the amplitude-modulated RF power may be applied to the susceptor or both the shower plate and the susceptor.

The present invention will be further explained with reference to the drawings. However, the drawings are not intended to limit the present invention.

Apparatus Configuration

[General]

Figure 1:
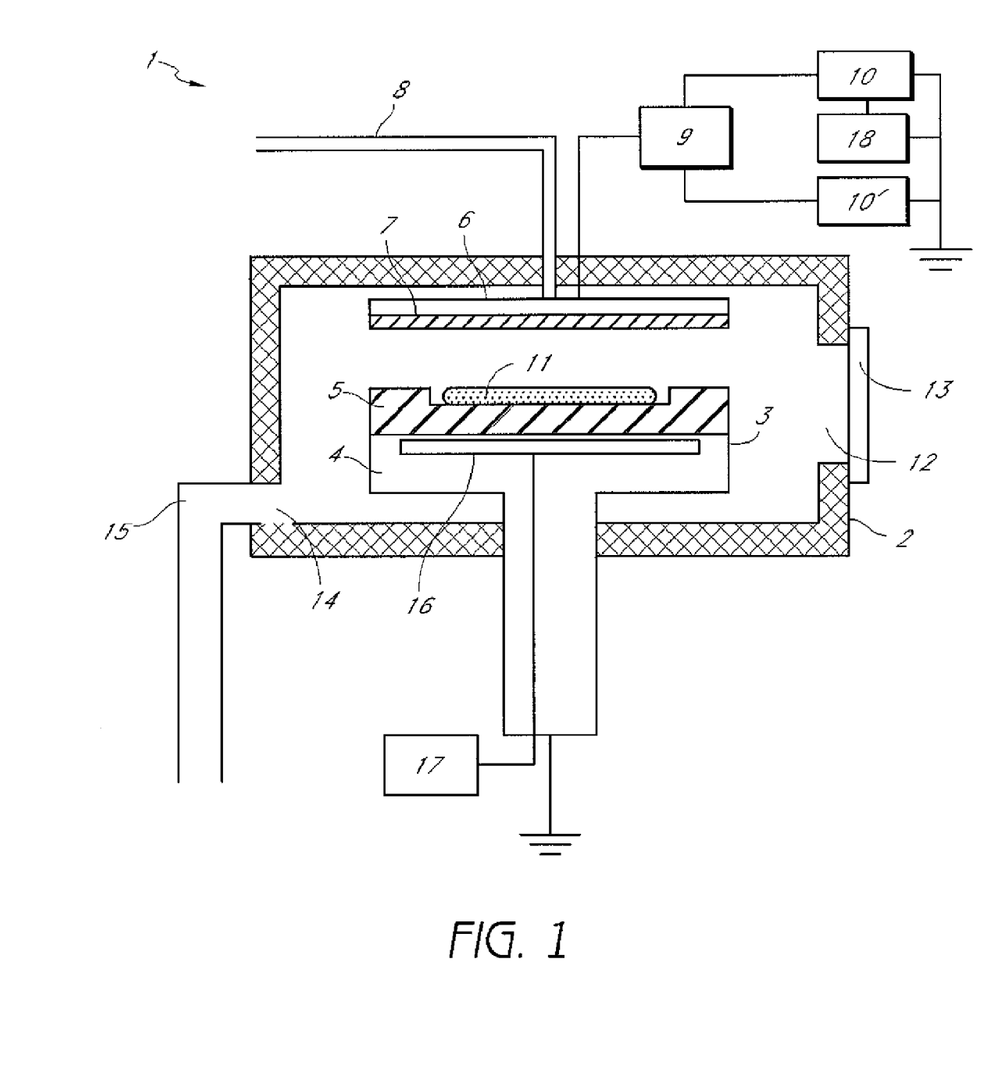
FIG. 1 is a schematic diagram of a plasma CVD apparatus for conducting an embodiment of the present invention.

FIG. 1 is a schematic diagram of a plasma CVD apparatus for conducting an embodiment of the present invention. In this figure, reference numerals denote the following: 1: Plasma CVD apparatus; 2: Reactor; 3: Substrate-supporting device; 4: Heating block; 5: Top plate; 6: Upper electrode; 7: Showerhead; 8: Reaction gas flow-in conduit; 9: Matching circuit; 10, 10': RF generators; 11: Semiconductor substrate; 12: Opening; 13: Gate valve; 14: Exhaust opening; 15: Exhaust pipe; 16: Heater; 17: Temperature controller; 18: Arbitrary waveform generator (amplitude modulator).

A plasma CVD apparatus 1 used to form a film on a semiconductor substrate comprises: a rector 2; a susceptor 3 on which to place a semiconductor substrate 11; a showerhead 7 provided in a manner facing the susceptor 3 and used to uniformly inject a reaction gas onto the semiconductor substrate 11; a gas flow-in conduit 8 that introduces a gas into the reactor; an exhaust opening 14 that evacuates the interior of the reactor; an opening 12 through which to load/unload the semiconductor substrate 11 into and out of the reactor; one type or two types of high-frequency (RF) generators 10, 10' used to apply a specified voltage or voltages; and a matching circuit 9 used to maintain the impedance at a specified level.

[Opening]

The opening 12 is provided in the side face of the reactor, and the reactor 2 is connected via a gate valve 13 to a loading chamber (not illustrated) used to load and unload a semiconductor substrate 11.

[Exhaust Opening]

The exhaust opening 14 is provided inside the reactor 2, and this exhaust opening 14 is connected to a vacuum evacuation pump (not illustrated) via a pipe 15. Provided between the exhaust opening 14 and vacuum pump is a mechanism to detect the pressure in the reactor and another mechanism to adjust the pressure, so that by using these mechanisms (not illustrated) the interior of the reactor can be controlled at a specified pressure.

[Upper Electrode]

The showerhead 7 is provided in the reactor 2 in a position where the showerhead faces the susceptor 3.

This showerhead 7 is connected to the reaction gas flow-in conduit 8 used to introduce a reaction gas, and the gas is injected into the reactor 2 through several thousand holes (not illustrated) provided in the bottom surface of the showerhead for the purpose of injecting the reaction gas onto the substrate. The showerhead 7 is also electrically connected to the RF generators 10, 10' via the RF matching circuit 9, to form one electrode 6 used in the implementation of plasma discharge.

[Lower Electrode]

The susceptor 3 provided in the reactor 2 for the purpose of placing a semiconductor 11 on top, comprises a top plate 5 having a placement surface for placing a semiconductor substrate on which an anodic oxidation film has been formed, and a heating block 4 with a built-in heater 16 used to heat the semiconductor substrate. The susceptor 3 is grounded and forms the other electrode used in the implementation of plasma discharge.

The top plate 5 is detachably affixed to the heating block 4 by means of screws, etc. However, no problem will be anticipated even when the top plate 5 and heating block 4 are joined together. The susceptor 3 is connected to a drive mechanism (not illustrated) which is provided outside the reactor 2 and used to move the susceptor 3 up and down. Installed in the heating block 4 is a heater 16 of resistance heating type, which is connected to an external power supply and a temperature controller 17. The heater 16 is controlled by the temperature controller 17 in a manner allowing the susceptor 3 to be heated to a desired temperature (between 300° C. and 650° C.).

The RF generators 10, 10' generate electric power at different frequencies of 13.56 MHz and 430 kHz, respectively, and these two levels of electric power are combined in the matching circuit 9 and the combined electric power is supplied to the reactor.

The RF generators 10, 10' are connected to an arbitrary waveform generator 18 that generates modulation signals to an outside circuit, so that the generators receive signals from the arbitrary waveform generator 18 and oscillate non-modulated RF power or RF power that has been modulated to an arbitrary waveform. The RF generators 10, 10' and arbitrary waveform generator 18 are controlled by the controller of the apparatus.

After a wafer 11 is placed on the susceptor 3, a reaction gas and a gas that does not react by itself, gas that does not contribute to any reaction, or any other gas (hereinafter collectively referred to as "additive gas") are introduced from the reaction gas flow-in conduit 8, and the interior of the reactor 2 is maintained at an arbitrary pressure.

Then, only the non-modulated RF power having a frequency of 13.56 MHz, or two levels of non-modulated RF power having frequencies of 13.56 MHz and 430 kHz, will be applied to the upper electrode 6 in the reactor 2 through the matching circuit 9 to form a film by means of plasma.

Also, a film termination process or other process in which electric discharge is implemented by using the additive gas alone, may be performed after the film forming process in order to adjust the film quality.

Operation Patterns

Typically, the operation is comprised of two steps: The first step is processing a substrate, and the second step is reducing floating potential of the substrate prior to unloading the substrate. The first step can comprise multiple steps including film formation steps and surface treatment steps. The second step can comprise multiple steps as long as the amplitude-modulated RF power is used at least one step in the second step. The present invention will be explained with reference to operation examples. However, the examples are not intended to limit the invention.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in embodiments can be modified by a range of at least ±50% in other embodiments, and the ranges applied in embodiments may include or exclude the endpoints.

Example 1

Figure 2:
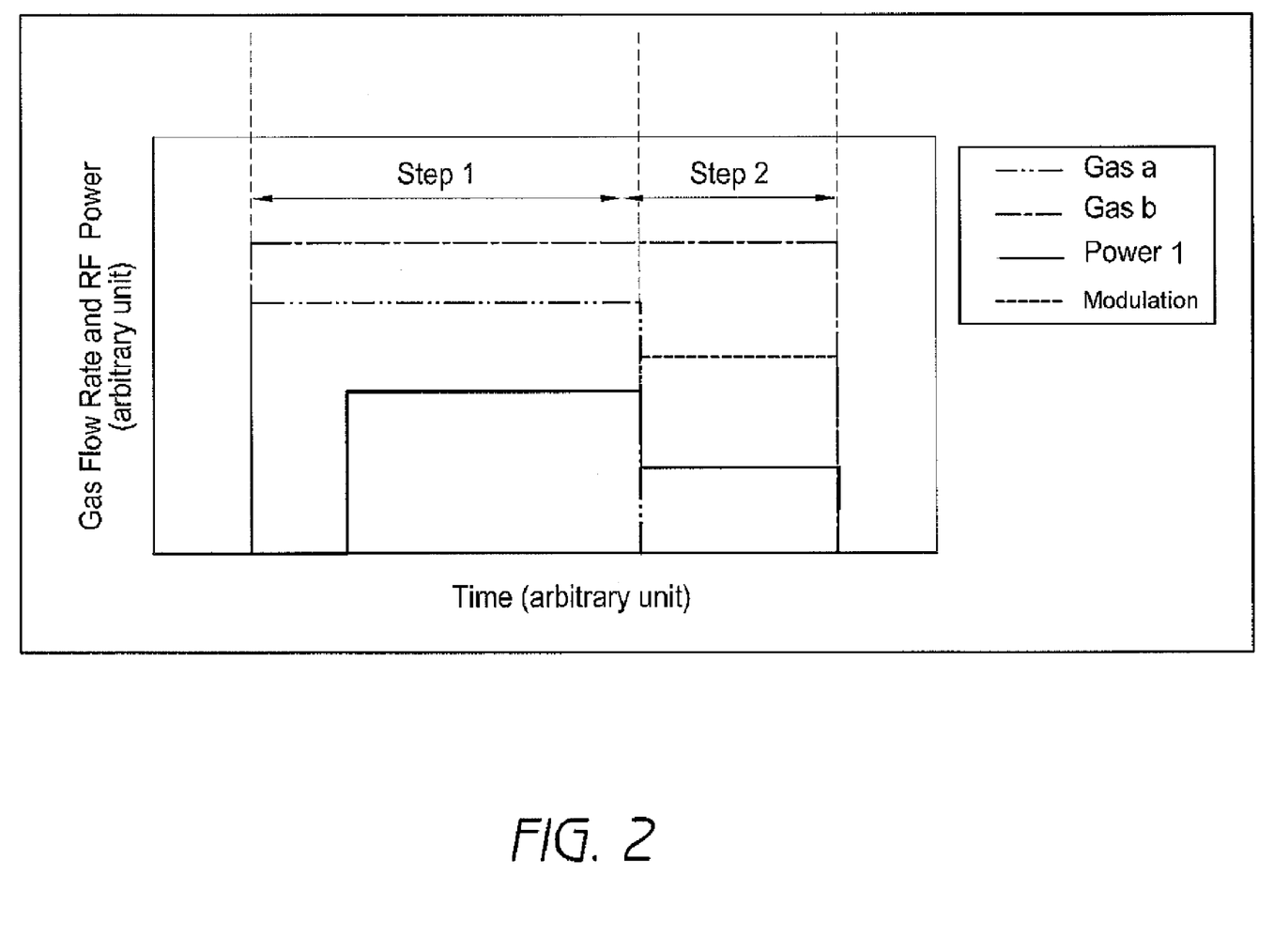
FIG. 2 is a graph showing operation patterns of control parameters in an embodiment of the present invention wherein amplitude-modulated RF power is applied constantly.

The best mode for carrying out the present invention is explained below by referring to FIG. 2.

Step 1 indicates a film forming process or film termination treatment process, while step 2 indicates a process of removing electric charges by means of modulation. In the figure, gas a indicates a reaction gas, while gas b indicates an additive gas. Both the vertical and horizontal axes represent arbitrary units, and changes along each axis are not scaled. Modulation is expressed by an on/off state.

The reaction gas is stopped and only the additive gas is supplied after the film forming process or film termination process has completed, and if RF power of 430 kHz is used, then application of the 430-kHz RF power is stopped and RF power of 13.56 MHz alone, which has been adjusted to 20 W, is applied for approx. 3 seconds at a constant electric power to cause discharge. At this time, the RF power is amplitude-modulated at a modulation frequency of 5 kHz and amplitude modulation ratio of 1.

In the above example, the electric power of 20 W is used. However, the electric power may be reduced to, for example, 5 W, as long as plasma is not lost (the specific level of electric power varies depending on the type of each gas used and the structure of the apparatus). Also, while the RF power frequencies are set to 13.56 MHz and 430 kHz above, other frequencies may be used in a range of 10 MHz or above but 100 MHz or below, and in a range of 300 kHz or above but 1000 kHz or below, respectively. Furthermore, the modulation frequency need not be 5 kHz, and any other frequency in a range of 100 Hz to 500 kHz can be used. Also, the amplitude modulation ratio may be set to an arbitrary value within a range of 0.25 to 1.2, instead of 1. Moreover, the period during which the modulated RF power is applied may be other than 3 seconds, as long as the period is 2 seconds or more.

Example 2

Figure 3:
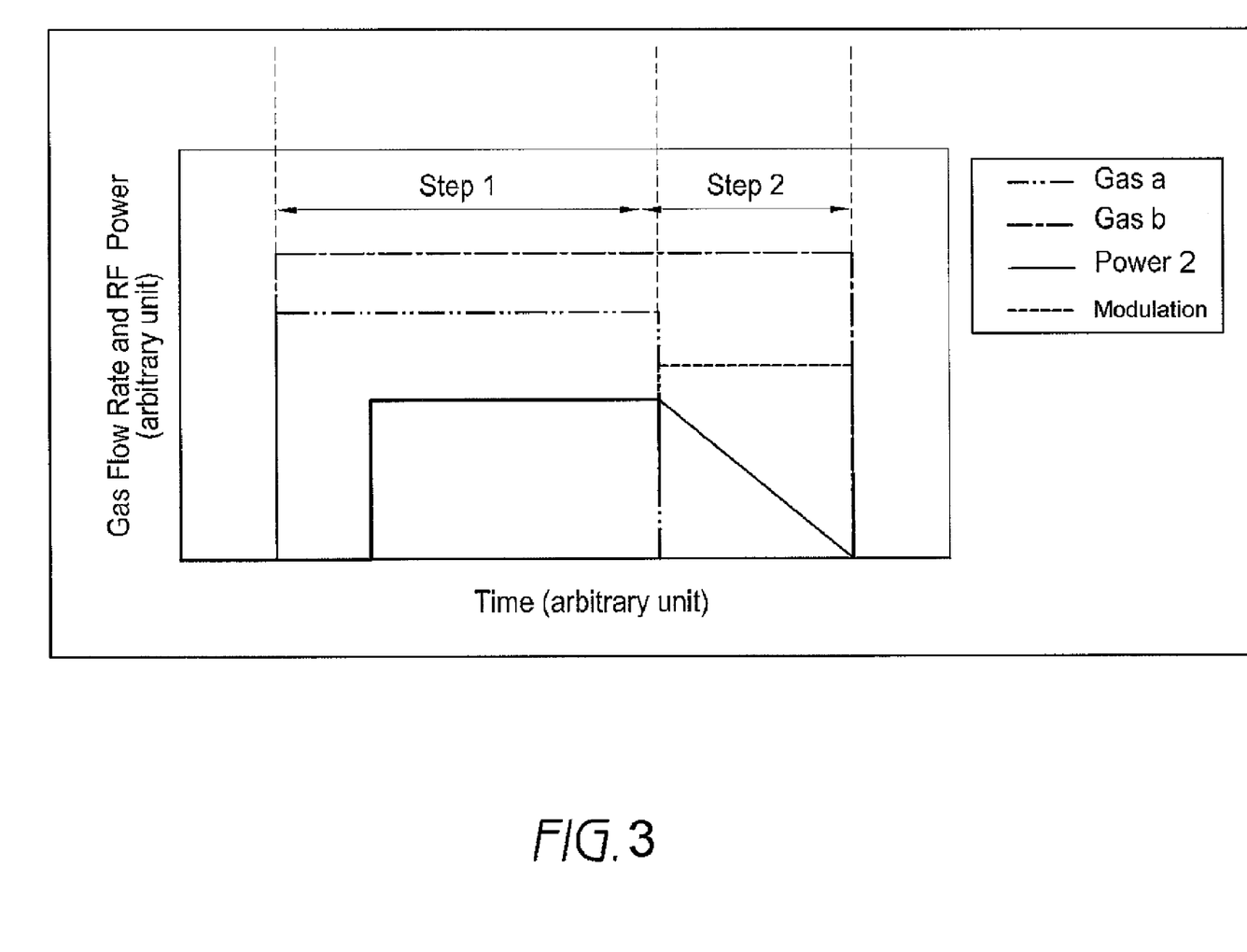
FIG. 3 is a graph showing operation patterns of control parameters in an embodiment of the present invention wherein amplitude-modulated RF power is ramped down.

Another example of the present invention is explained below by referring to FIG. 3.

Step 1 indicates a film forming process or film termination treatment process, while step 2 indicates a process of removing electric charges by means of modulation. In the figure, gas a indicates a reaction gas, while gas b indicates an additive gas.

The reaction gas is stopped and only the additive gas is supplied after the film forming process or film termination process has completed, and if RF power of 430 kHz is used, then application of the 430-kHz RF power is stopped and RF power of 13.56 MHz alone is applied for approx. 3 seconds.

At this time, the RF power is amplitude-modulated at a modulation frequency of 5 kHz and amplitude modulation ratio of 1, and the electric power is gradually decreased from the same level used during the film forming process in such a way that the electric power becomes 0 W when the process ends (the electric power is decreased linearly).

In the above example, the modulation frequency need not be 5 kHz, and any other frequency in a range of 100 Hz to 500 kHz can be used. Also, the amplitude modulation ratio may be set to an arbitrary value within a range of 0.25 to 1.2, instead of 1. Moreover, the period during which the modulated RF power is applied may be other than 3 seconds, as long as the period is 2 seconds or more.

Example 3

Figure 4:
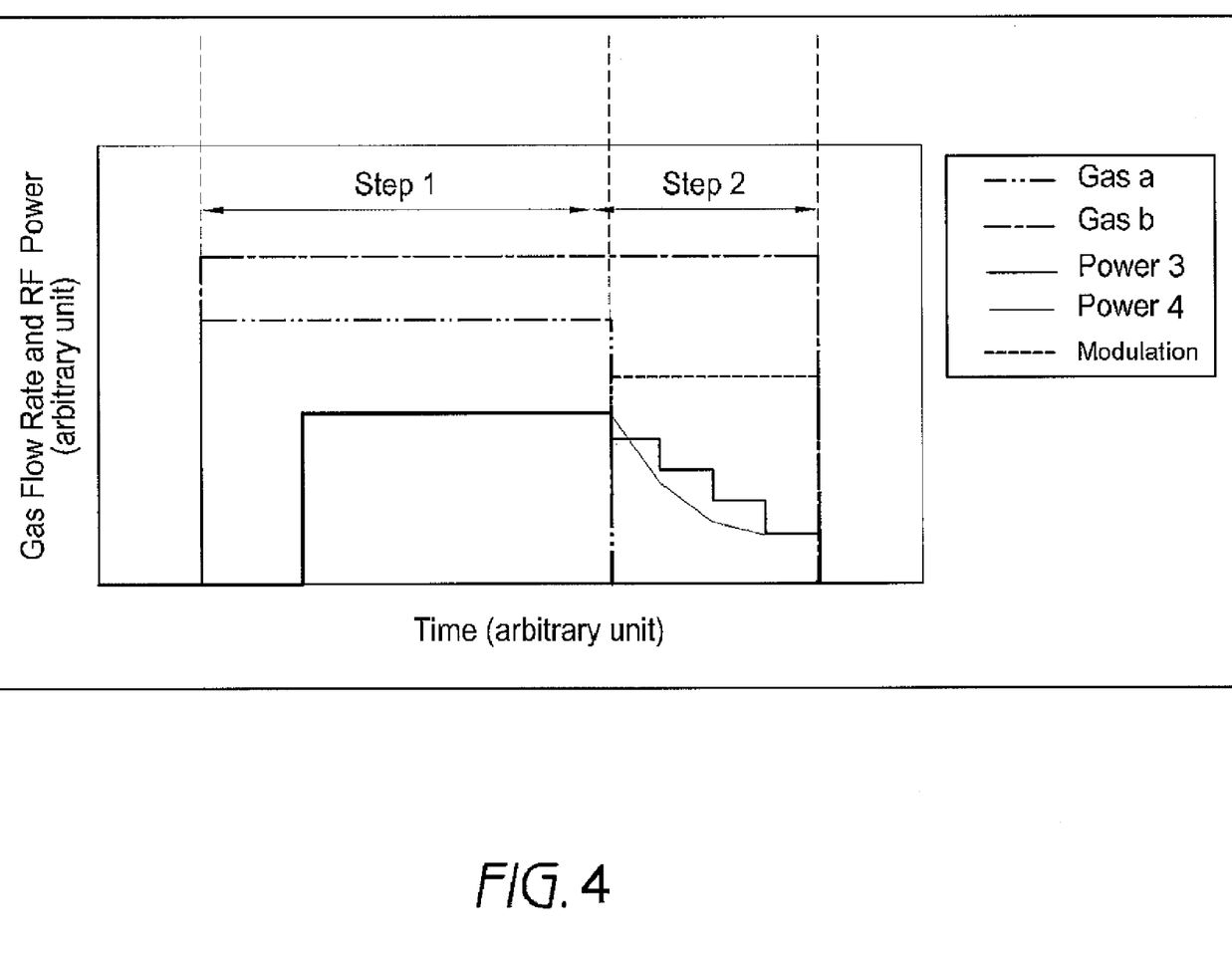
FIG. 4 is a graph showing operation patterns of control parameters in embodiments of the present invention wherein amplitude-modulated RF power is reduced in steps, and amplitude-modulated RF power is reduced at different rates.

Although the electric power is gradually decreased in Example 2 given above, the voltage may be lowered in several steps as shown in FIG. 4, or the rate at which the voltage is lowered may be changed in each of these steps. It is also possible to combine Examples 1, 2 and/or 3.

Experimental Examples

Figure 5:
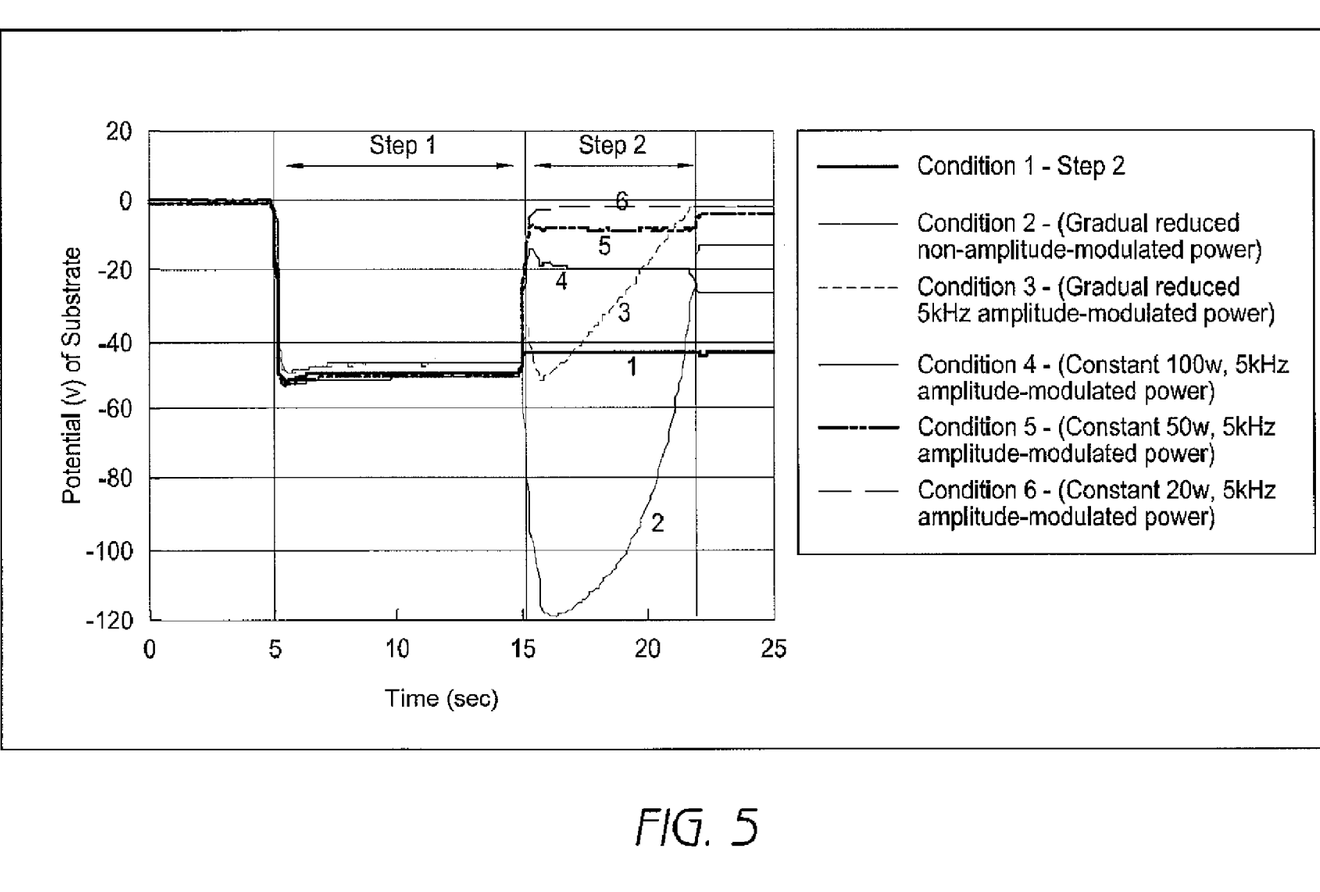
FIG. 5 is a graph showing operation patterns of control parameters wherein various post-film forming RF power applications are employed in Comparative Examples and Examples of the present invention.
Figure 6:
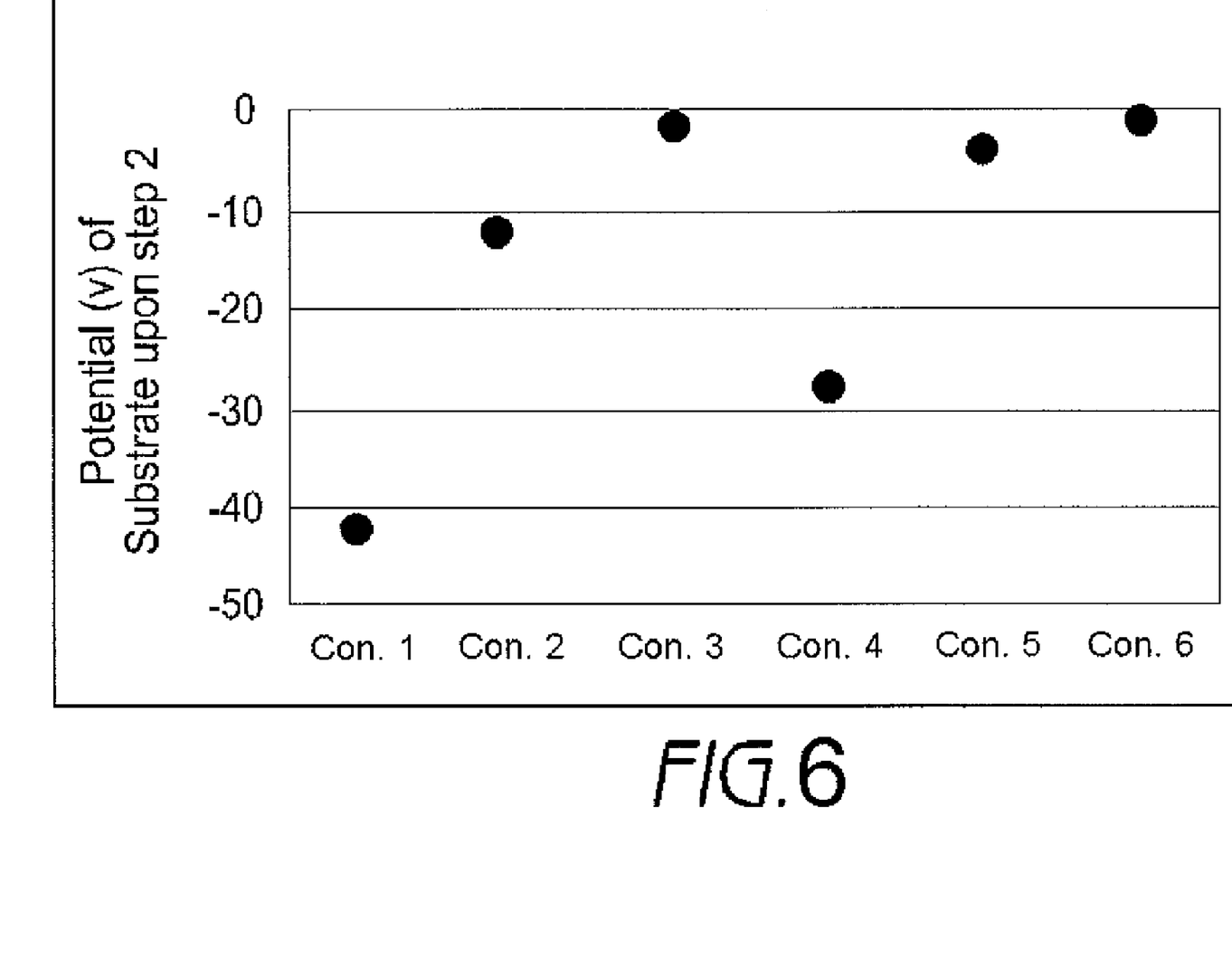
FIG. 6 is a graph showing potential (V) of substrates upon the post-film forming RF power application in Comparative Examples and Examples of the present invention.

The results of processes performed in Examples 1 and 2 are shown in FIGS. 5 and 6. The apparatus shown in FIG. 1 was used to process substrates under the conditions specified in Tables 1 to 3 below, and the resulting floating voltages were measured and compared. (For your information, the floating voltages were measured according to the Vf measurement method disclosed in U.S. patent application Ser. No. 11/847,962, also filed by the same applicant who filed the application for the present invention. The disclosure of the application is herein incorporated by reference in its entirety.)

TABLE 1

| Apparatus temperature conditions | | |
| --- | --- | --- |
| Heater temperature | Upper electrode temperature | Wall temperature |
| 400° C. | 130° C. | 110° C. |

TABLE 2

| Conditions for step 1 (common) | | | | |
| --- | --- | --- | --- | --- |
| TEOS | O2 | HRF | LRF | Pressure |
| 86 sccm | 800 sccm | 285 W | 0 W | 3.00 Torr |

TABLE 3

| | | Conditions for step 2 | | | | | |
| --- | --- | --- | --- | --- | --- | --- | --- |
| Condition | Process | O2 | Pressure | HRF | Modulation frequency | Amplitude modulation ratio | Period |
| 1 | Processing ended after film was formed | — | — | — | — | — | — |
| 2 | Not modulated (electric power decreased gradually) | 800 sccm | 3.00 Torr | 285 W → 0 W | — | | 7 seconds |

TABLE 3-continued

| | | Conditions for step 2 | | | | | |
|---|---|---|---|---|---|---|---|
| Condition | Process | O2 | Pressure | HRF | Modulation frequency | Amplitude modulation ratio | Period |
| 3 | Modulated (electric power decreased gradually) | 800 sccm | 3.00 Torr | 285 W → 0 W | 5 kHz | 1 | 7 seconds |
| 4 | Modulated (100 W) Modulated (100 W) | 800 sccm | 3.00 Torr | 100 W | 5 kHz | 1 | 7 seconds |
| 5 | Modulated (50 W) | 800 sccm | 3.00 Torr | 50 W | 5 kHz | 1 | 7 seconds |
| 6 | Modulated (20 W) | 800 sccm | 3.00 Torr | 20 W | 5 kHz | 1 | 7 seconds |

FIG. 5 shows how the substrate voltage changes over time when the setting of electric power and modulation conditions are changed in step 2. FIG. 6 shows the substrate voltages measured after completion of processing under respective conditions.

Only an oxygen gas was used in this experiment. Under Condition 1, the electric power and gas supply were stopped immediately after the end of step 1 and step 2 was not performed. Under Condition 2, the electric power was gradually decreased to 0 in step 2 without modulation. Under Condition 3, the electric power was gradually decreased to 0 in step 2 with amplitude modulation at 5 kHz. Under Conditions 4 to 6, the electric power was not decreased gradually but kept at a constant level under amplitude modulation at 5 kHz. The settings of electric power used were 100 W, 50 W and 20 W, respectively.

The results are shown in Table 4.

TABLE 4

| Condition | Description | Substrate voltage |
|---|---|---|
| 1 | Processing ended after step 1 | −43.0 V |
| 2 | Not modulated (electric power gradually decreased) | −13.0 V |
| 3 | Modulated (electric power gradually decreased) | −2.0 V |
| 4 | Modulated, with electric power kept at 100 W (constant) | −26.7 V |
| 5 | Modulated, with electric power kept at 50 W (constant) | −3.9 V |
| 6 | Modulated, with electric power kept at 20 W (constant) | −1.2 V |

When the electric power was kept constant in step 2, the substrate voltage measured after the end of step 2 changed according to the electric power in step 2, where the smaller the electric power, the lower the substrate voltage became and the substrate voltage became −1.2 V when the electric power was 20 W. When the electric power was gradually decreased in step 2, applying amplitude modulation in step 2 allowed the substrate voltage to be reduced to a sufficiently low level compared to when modulation was not applied. In addition, it was possible to reduce the substrate voltage to a sufficiently low level over a short period of time by maintaining the electric power at 20 W from the beginning, instead of gradually decreasing the amplitude-modulated electric power in step 2.

The present invention includes the above mentioned embodiments and other various embodiments including the following:

1) A method for reducing the floating potential of a substrate after a film has been formed on the substrate by means of plasma CVD, wherein only a non-film-forming gas is supplied and modulated RF power is applied to perform plasma processing.

2) A method according to 1) above, wherein the modulated RF power is constant and has an electric power equal to or lower than the electric power used during the film forming process.

3) A method according to 1) or 2) above, wherein the modulated RF power is constant in a range of 5 W to 50 W.

4) A method according to 1) above, wherein the modulated RF power decreases gradually over time.

5) A method according to any one of 1) to 4) above, wherein the RF power is modulated by means of amplitude modulation using sine waves at a frequency of 100 Hz to 500 kHz and an amplitude modulation ratio of 0.25 to 1.2.

6) A method according to any one of 1) to 5) above, wherein the RF power is modulated by means of amplitude modulation using sine waves at a frequency of 1 kHz to 10 kHz and an amplitude modulation ratio of 0.8 to 1.0.

7) A method according to any one of 1) to 6) above, wherein the non-film-forming gas is $N_2$, $N_2O$, $O_2$, Ar, or He.

8) A method according to any one of 1) to 7) above, wherein the plasma processing using HRF modulation is performed for 2 seconds or more but 10 seconds or less.

9) A method according to any one of 1) to 7) above, wherein the plasma processing using HRF modulation is performed for 2 seconds or more but 3 seconds or less.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for processing a substrate by plasma CVD, comprising:
   (i) forming a film on a substrate placed on a susceptor by applying non-modulated RF power between the susceptor and a shower plate in the presence of a film-forming gas in a reactor; and (ii) upon completion of step (i), without unloading the substrate, switching the non-modulated RF power to amplitude-modulated RF power and applying the amplitude-modulated RF power between the susceptor and the shower plate in the absence of a film-forming gas but in the presence of a non-film-forming gas to reduce a floating potential of the substrate, wherein the amplitude-modulated RF power used in step (ii) has an electric power lower than the electric power of the non-modulated RF power used in step (i).

2. The method according to claim 1, wherein the amplitude-modulated RF power used in step (ii) is constant.

3. The method according to claim 2, wherein the amplitude-modulated RF power used in step (ii) has an electric power of 5 W to 50 W.

4. The method according to claim 1, wherein the amplitude-modulated RF power used in step (ii) is ramped down continuously.

5. The method according to claim 1, wherein the amplitude-modulated RF power used in step (ii) is amplitude-modulated with a sine wave of 100 Hz to 500 kHz and has an amplitude modulation ratio of 0.25 to 1.2.

6. The method according to claim 1, wherein the amplitude-modulated RF power used in step (ii) is amplitude-modulated with a sine wave of 1 kHz to 10 kHz and has an amplitude modulation ratio of 0.8 to 1.0.

7. The method according to claim 1, wherein the non-film-forming gas is $N_2$, $N_2O$, $O_2$, Ar, or He.

8. The method according to claim 1, wherein step (ii) is performed for 2 seconds or more but 10 seconds or less.

9. The method according to claim 1, wherein step (ii) is performed for 2 seconds or more but 3 seconds or less.

10. The method according to claim 1, wherein step (ii) is initiated without extinction of a plasma in the reactor.

11. The method according to claim 1, wherein the amplitude-modulated RF power has a frequency of 2 MHz or higher.

12. The method according to claim 1, wherein the film-forming gas in step (i) comprises a source gas and an additive/carrier gas, and the non-film-forming gas in step (ii) comprises the additive/carrier gas without the source gas.

13. The method according to claim 1, further comprising unloading the substrate upon completion of step (ii).

14. The method according to claim 1, wherein step (ii) is initiated immediately before unloading the substrate.

15. A method for reducing a floating potential of a substrate on a susceptor in a plasma CVD reactor, comprising:
upon completion of processing the substrate in the reactor using non-modulated RF power and before unloading the substrate, switching the non-modulated RF power to amplitude-modified RF power and applying the amplitude-modulated RF power between the susceptor and a shower plate in the absence of a film-forming gas but in the presence of a non-film-forming gas for reducing a floating potential of the substrate to a set level, wherein the amplitude-modulated RF power has an electric power lower than the electric power of the non-modulated RF power used in processing the substrate.

16. The method according to claim 15, wherein the amplitude-modulated RF power has an amplitude modulation ratio of 0.25 to 1.2.

17. The method according to claim 15, wherein the amplitude-modulated RF power is amplitude-modulated with a sine wave of less than 500 kHz.

18. The method according to claim 15, wherein the amplitude-modulated RF power is generated by amplitude-modulating RF power which is reduced with time toward the end of the step of applying the amplitude-modulated RF power.

19. The method according to claim 15, wherein the non-film-forming gas is $O_2$, $N_2$, or $N_2O$.

20. The method according to claim 15, wherein the non-film-forming gas comprises an additive/carrier gas without a source gas used in the film formation.

21. The method according to claim 15, wherein the applying of the amplitude-modulated RF power is conducted to reduce a floating potential of the substrate to 1/10 or less of a floating potential of the substrate obtained with RF power without the amplitude modulation.

22. The method according to claim 14, wherein the amplitude-modulated RF power is applied to the shower plate.

23. The method according to claim 3, wherein the amplitude-modulated RF power used in step (ii) has an electric power of 5 W to 40 W.

24. The method according to claim 1, wherein the susceptor is provided with only one electrode which is used for application of RF power.

* * * * *